United States Patent [19]

Yasutake et al.

[11] Patent Number: 4,651,033

[45] Date of Patent: Mar. 17, 1987

[54] DEVICE FOR COMPLEMENTARY INPUT SIGNALS USING TWO CIRCUITS WITH DIFFERENT THRESHOLD VOLTAGES

[75] Inventors: Nobuyuki Yasutake; Toshitaka Tsuda, both of Yokohama, Japan

[73] Assignee: Fujitsu Limited, Kawasaki, Japan

[21] Appl. No.: 574,725

[22] Filed: Jan. 27, 1984

[30] Foreign Application Priority Data

Jan. 31, 1983 [JP] Japan .................................. 58-014058

[51] Int. Cl.[4] .......................................... H03K 17/30
[52] U.S. Cl. ...................................... 307/494; 307/355; 307/360; 307/200 A; 307/315
[58] Field of Search ........... 307/200 A, 443, 454–455, 307/494, 530, 350, 355, 360, 243, 254, 297, 315; 340/347 DA; 330/252, 261; 365/190, 208

[56] References Cited

U.S. PATENT DOCUMENTS

| | | | |
|---|---|---|---|
| 3,723,761 | 3/1973 | Masaki | 307/443 X |
| 4,415,815 | 11/1983 | Dijkmans et al. | 307/243 |
| 4,494,020 | 1/1985 | Konishi | 307/530 |
| 4,538,075 | 8/1985 | Varadarajan | 307/443 X |
| 4,587,444 | 5/1986 | Emori et al. | 307/455 X |

FOREIGN PATENT DOCUMENTS

| | | | |
|---|---|---|---|
| 0002161 | 1/1977 | Japan | 307/455 |
| 1228491 | 4/1971 | United Kingdom | 307/455 |

Primary Examiner—Stanley D. Miller
Assistant Examiner—D. R. Hudspeth
Attorney, Agent, or Firm—Staas & Halsey

[57] ABSTRACT

A differential switching circuit includes a first current switching circuit having a first input terminal; a second current switching circuit having a second input terminal and a threshold different from that of the first circuit; and a constant current source commonly connected to the first and second circuits. Complementary input signals are applied to the first and second input terminals.

3 Claims, 11 Drawing Figures

DEVICE FOR COMPLEMENTARY INPUT SIGNALS USING TWO CIRCUITS WITH DIFFERENT THRESHOLD VOLTAGES

BACKGROUND OF THE INVENTION

1. Field of the Invention

The present invention relates to a differential switching circuit, more particularly a differential switching circuit comprising a pair of transistors having commonly coupled emitters used for a digital to-analog (D/A) convertor.

2. Description of the Prior Art

Prior art differential switching circuits, composed of a pair of transistors having commonly coupled emitters with a fixed current source connected to the emitters, suffer from the defect of an unstable output potential due to temperature-based variations of the current amplification. Additionally, there is the problem, in D/A converters etc., using a plurality of such differential switching circuits, of variation of current amplification factors hFE due to manufacturing differences in the elements in the circuits.

A conventional technique used to overcome the fluctuations, in a circuit used for a D/A converter with a resolution above 12 bits has been to provide an additional transistor for each transistor in the pair of transistors in a so-called "Darlington connection." The Darlington Connections, however, reduce the operating speed of the circuit. To raise the speed, a resistor has been inserted between the two transistors in each of the Darlington connections. However, this results in current fluctuation through the resistor.

In summary, the prior art differential switching circuit has had the defect of reduced operating speed when there is stable current amplification, and unstable current amplification when the operating speed is increased.

SUMMARY OF THE INVENTION

An object of the present invention is to provide a differential switching circuit with both stable current amplification and increased operating speed.

The above-mentioned object can be achieved by a differential switching circuit which includes a first current switching circuit having a first input terminal; a second current switching circuit having a second input terminal and a threshold different from that of the first circuit; and a constant current source commonly connected to the first and second circuits, complementary input signals being applied to the first and second input terminals.

BRIEF DESCRIPTION OF THE DRAWINGS

Further features and advantages of the present invention will be apparent from the ensuing description with reference to the accompanying drawings, wherein:

FIG. 3a is a circuit diagram of an embodiment of the present invention;

FIGS. 3b and 3c are waveform diagrams of the signals applied to the circuit of FIG. 3a;

FIGS. 4a to 4d are functional views of the circuit diagram in FIG. 3a; and

DESCRIPTION OF THE PREFERRED EMBODIMENTS

Figure 1:
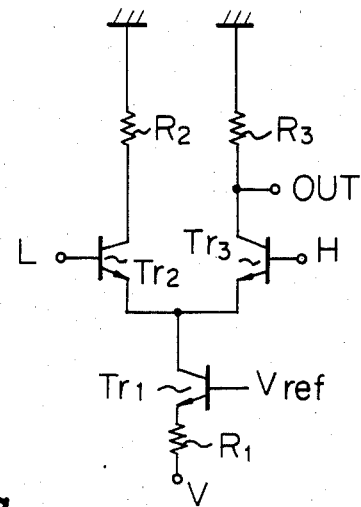
FIGS. 1, 2a and 2b are circuit diagrams of conventional differential switching circuits.

Before describing the preferred embodiments, an explanation of some prior art circuits will be given for comparison. FIG. 1 is a circuit diagram of one type of conventional circuit. This circuit consists of a pair of transistors $T_{r2}$ and $T_{r3}$ having commonly connected emitters. Resistors $R_2$ and $R_3$ are connected to the collectors of the transistors $T_{r2}$ and $T_{r3}$, respectively. A constant current source, connected to the commonly connected emitters, consists of a transistor $T_{r1}$ and a resistor $R_1$ connected to a voltage source V. A constant voltage $V_{ref}$ is applied to the base of the transistor $T_{r1}$.

When the base potential of the transistor $T_{r3}$ is higher than that of the transistor $T_{r2}$, the transistor $T_{r3}$ is on and a current flows through the resistor $R_3$. Therefore, the potential of the output terminal OUT is low. On the other hand, when the base potential of the transistor $T_{r3}$ is lower than that of the transistor $T_{r2}$, current cannot flow through the resistor $R_3$ and thus the potential of the output terminal OUT is high.

The above circuit has the defect that the output potential fluctuates along with temperature-based a variation in the current amplification factor hFE. That is, even though a constant current is passed through the emitter of the transistor $T_{r3}$ when the transistor $T_{r3}$ is on, the ratio of the currents of the collector and base changes along with the temperature.

Figure 2A:
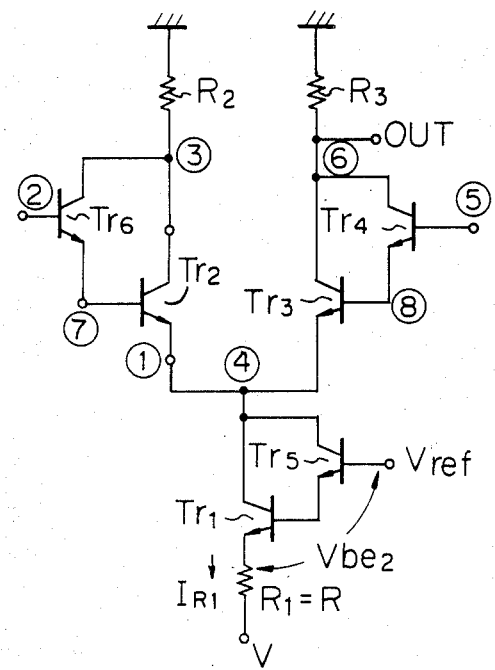

To overcome these and other fluctuations, as shown in FIG. 2(a), additional transistors $T_{r4}$, $T_{r6}$ and $T_{r5}$ have been provided for the transistors $T_{r3}$, $T_{r2}$ and $T_{r1}$, respectively, each in a Darlington connection with their respective transistors. Assuming, the current amplification factors hFE of the transistors $T_{r3}$ and $T_{r4}$ are equal, the current amplification factor hFE of the Darlington connection circuit consisting of the transistors $T_{r3}$ and $T_{r4}$ is $(hFE)^2$. This reduces the influence of fluctuations of the current amplification factor hFE on the current passing through the resistor $R_3$. The same applies to the Darlington connection circuits consisting of the transistors $T_{r2}$ and $T_{r6}$ and the transistors $T_{r1}$ and $T_{r5}$.

Figure 2B:
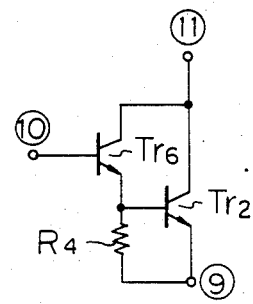

The differential switching circuit illustrated in FIG. 2a, however, has the defect of reduced operating speed as both the left switch consisting of the transistors $T_{r2}$ and $T_{r6}$ and the right switch consisting of the transistors $T_{r3}$ and $T_{r4}$ are Darlington connection circuits. Specifically, the speed is reduced since the potentials at connections ⑦, ④, and ⑧ are not determined immediately upon input of the signal to terminals ② and ⑤. To overcome this defect, a resistor $R_4$ has been inserted between the emitters of the transistors $T_{r6}$ and $T_{r2}$ in another circuit partially illustrated in FIG. 2b. This, however, results in fluctuation of the current.

The differential switching circuit of the present invention comprises a first current switching circuit having a first input terminal; a second current switching circuit having a second input terminal and a switching threshold different from that of the first circuit; and a constant current source commonly connected to the first and second circuits. Complementary input signals are applied to the first and second input terminals.

Figures 3A, 3B, 3C:
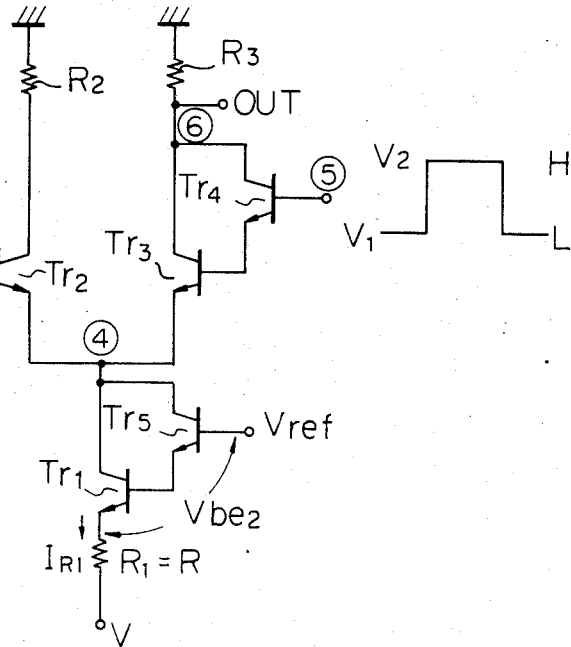

FIG. 3a is a diagram of a circuit in accordance with an embodiment of the invention. In the circuit of FIG. 3a, complementary signals illustrated in FIG. 3b and 3c are input to the left transistor $T_{r2}$ and the right transistors $T_{r3}$ and $T_{r4}$ at ② and ⑤, respectively. The on-and-off switching of these transistors changes the potential at a connection ④. When a high "H" voltage $V_2$ is applied to a terminal ⑤ and a low "L" voltage $V_1$ is applied to a terminal ②, the transistors $T_{r3}$ and $T_{r4}$ are on, and the transistor $T_{r2}$ is off. In this case, the relationship $V_2-V_1>0.8$ V must be satisfied, the value 0.8 V being the voltage drop from the base to the emitter in each of the transistors $T_{r2}$, $T_{r3}$ and $T_{r4}$. Therefore, the potential at the connection ④ is about $V_2-1.5$ V.

When the "L" voltage $V_1$ is applied to the terminal ⑤ and the "H" voltage $V_2$ is applied to the terminal ②, the transistor $T_{r2}$ is on and the transistors $T_{r3}$ and $T_{r4}$ are off. In this case, the potential at the connection ④ is $V_2-0.8$ V, which is higher than $V_2-1.5$ V in the first case where the transistors $T_{r3}$ and $T_{r4}$ are on. Therefore, as the electrons in the emitter of the transistor $T_{r3}$ are pulled to the emitter of the transistor $T_{r2}$, the transistor $T_{r3}$ is cut off immediately. In this circuit, the flow of electrons between the transistors $T_{r2}$ and $T_{r3}$ contributes to high speed switching.

This circuit will be explained further in reference to FIGS. 4a to 4d, wherein n-p-n type transistors are depicted. When the voltage $V_1$ is applied to the base of the transistor $T_{r2}$ and the voltage $V_2$ is applied to the base of the transistor $T_{r4}$ i.e., in the steady state where the transistors $T_{r3}$ and $T_{r4}$ are on and the transistor $T_{r2}$ is off (see FIG. 4a), the base-emitter junction of the transistor $T_{r3}$ is forward biased and the potential of the emitter side of the junction face ⑬ is about $V_2-1.5$ V. On the other hand, because of the steady state, the base-emitter junction of the transistor $T_{r2}$ is reverse biased. Thus, the potential of the emitter side of the junction face ⑫ and the connection ④ are also $V_2-1.5$ V.

When the voltage $V_2$ is applied to the transistor $T_{r2}$ and the voltage $V_1$ is applied to the transistor $T_{r4}$ (see FIG. 4b), the base-emitter junction of the transistor $T_{r2}$ is forward biased. The transistor $T_{r2}$ starts to turn on, and the potential of the emitter side of the base-emitter junction of the transistor $T_{r2}$ immediately starts to become $V_2-0.8$ V. On the other hand, the voltage $V_1$ applied to the base of the transistor $T_{r4}$ tries to reverse bias the base-emitter junctions of the transistors $T_{r3}$ and $T_{r4}$. The time necessary for this reverse bias is longer than that for the forward bias between the base and emitter of the transistor $T_{r2}$. Therefore, even though the potential of the emitter side face ⑫ of the base-emitter junction of the transistor $T_{r2}$ approaches $V_2-0.8$ V, the potential of the face ⑬ of the transistor $T_{r3}$ is near $V_2-1.5$ V.

Figure 4A:
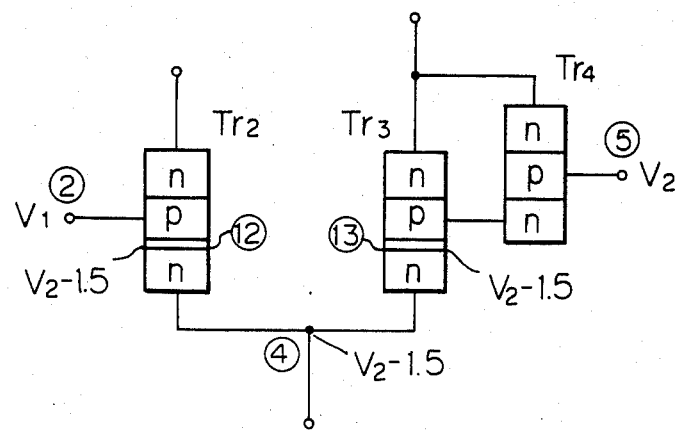
Figure 4B:
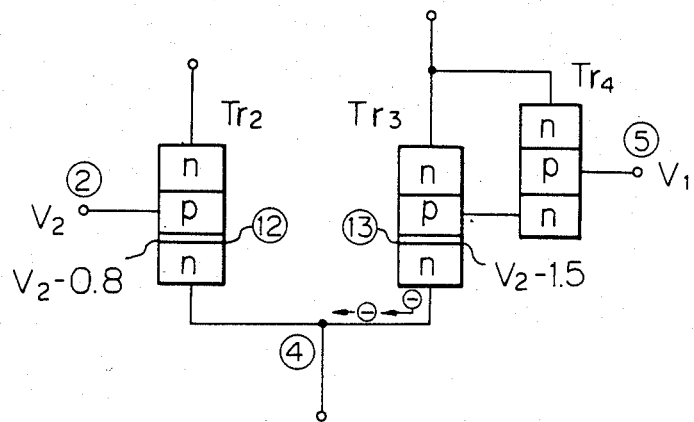

In this transient state, illustrated in FIG. 4(b), the potential difference between the junction faces ⑫ and ⑬ is about 0.7 V, by which difference the electrons of the majority carrier are moved from the emitter of the transistor $T_{r3}$ to that of the transistor $T_{r2}$. The result is that the transistor $T_{r2}$ starts to turn on as the emitter of the transistor $T_{r2}$ pulls more electrons from the emitter of the transistor $T_{r3}$. Meanwhile, the transistor $T_{r3}$ starts to turn off, and the potential of the emitter of the transistor $T_{r3}$ approaches $V_2-0.8$ V as time passes. During this time, $T_{r3}$ and $T_{r4}$ act together and both turn off more completely.

Figure 4C:
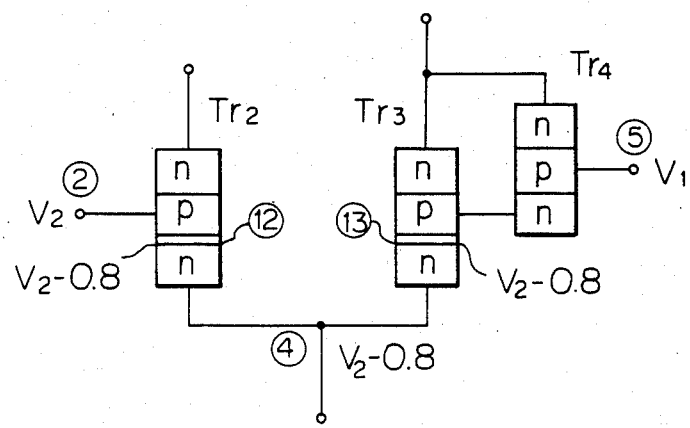
Figure 4D:
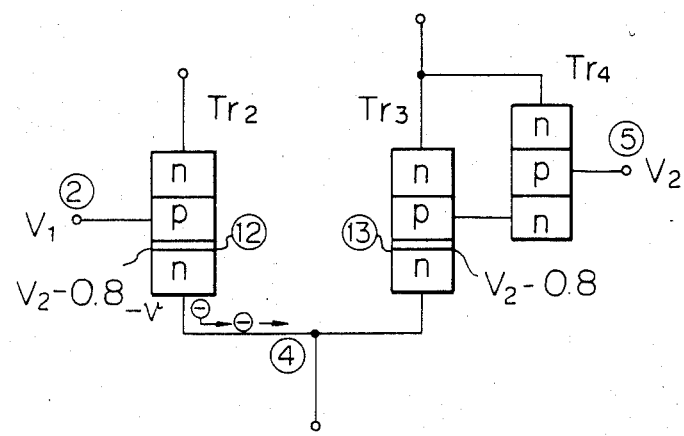

FIG. 4c shows a steady state where the transistor $T_{r2}$ is on and the transistors $T_{r3}$ and $T_{r4}$ are off. In this state, the potentials of the faces ⑫ and ⑬ and the connection ④ are all $V_2-0.8$ V. When the voltage $V_1$ is applied to the transistor $T_{r2}$ and the voltage $V_2$ is applied to the transistor $T_{r4}$, the transistor $T_{r2}$ starts to turn off and the transistors $T_{r3}$ and $T_{r4}$ start to turn on (FIG. 4d). However, while the potential of the emitter of the transistor $T_{r2}$ is changed immediately, the potential of the emitter of the transistor $T_{r3}$ does not. That is to say, as the voltage $V_1$ is applied to the base of the transistor $T_{r2}$ in the on state, the potential of the junction face ⑫ starts to fall to $V_2-0.8$-V. In this case, the potential of the face ⑬ is $V_2-0.8$ V. Therefore, the potential difference $V(>0)$ moves the electrons from the emitter of the transistor $T_{r2}$ to that of the transistor $T_{r3}$. The result is that the transistor $T_{r2}$ is off and the transistor $T_{r3}$ is on.

As is clear from the above explanation, when the transistors $T_{r3}$ and $T_{r4}$ turn on or off, the transistor $T_{r2}$ supplies or pulls electrons. In other words, the transistor $T_{r2}$ assists the operation of the transistors $T_{r3}$ and $T_{r4}$. As a result, a circuit constructed in accordance with this invention can operate at a high speed even with small complementary signals.

In the circuit of FIG. 3, unlike conventional switching circuits of the left-and-right symmetric type, the potential at the connection ④ changes at about 0.7 V depending on whether the transistor $T_{r2}$ or the transistors $T_{r3}$ and $T_{r4}$ are on. The 0.7 V fluctuation in the potential at the connection causes the voltage difference $V_{be2}$ between the base of the transistor $T_{r5}$ and the emitter of the transistor $T_{r1}$ to fluctuate due to the so-called "early effect". As a result, the potential at the emitter of the transistor $T_{r1}$ also fluctutates. In an actual circuit, the fluctuation is about 2 mV. Therefore, the current $I_{R1}$ through the resistor $R_1$ fluctuates, which adversely affects the stability of the circuit. This current $I_{R1}$ is expressed by the following equation:

$$I_{R1} = 1/R\{(V_{ref} - V_{be2}) - V\}$$

where $V_{ref}$ is the reference potential applied to base of transistor $T_{r5}$, $V_{be2}$ is the voltage difference between base of transistor $T_{r5}$ and emitter of transistor $T_{r1}$ and V is the potential at the terminal of resistor $R_1$.

Figure 5:
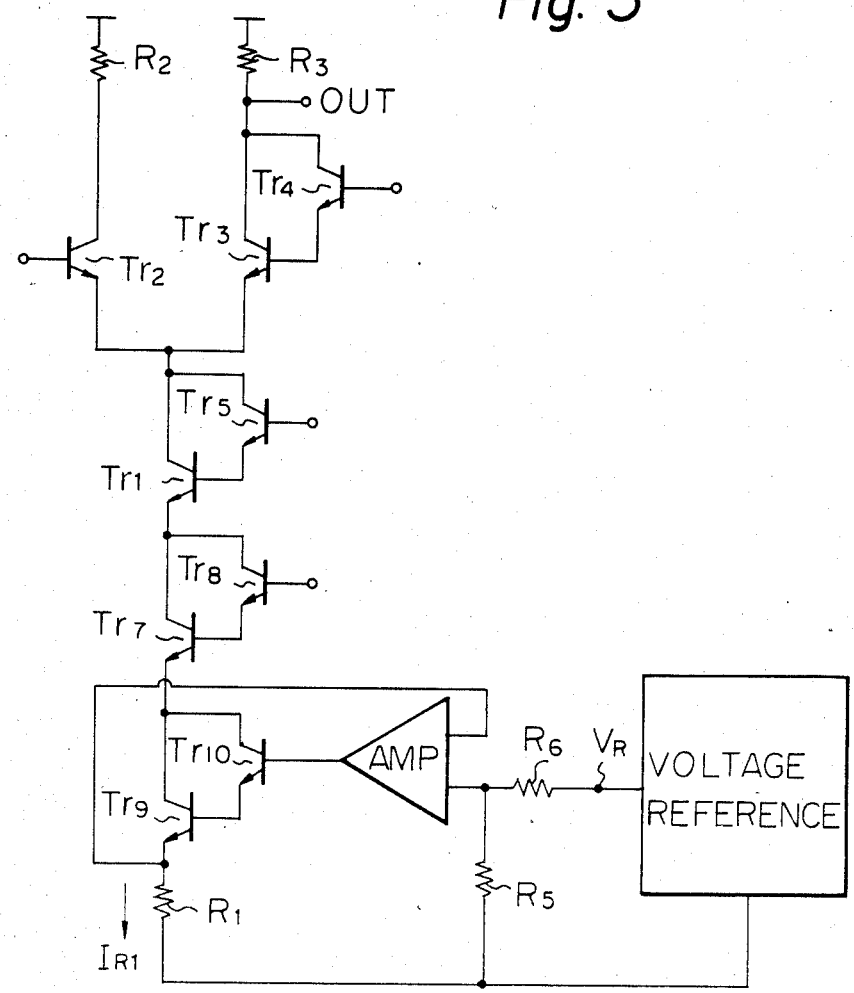
FIG. 5 is a circuit diagram of another embodiment of the present invention.

FIG. 5 shows another embodiment of the present invention, in which the current fluctuation is prevented. In the circuit in FIG. 5, buffer transistors $T_{r5}$ and $T_{r1}$ and $T_{r8}$ and $T_{r7}$ are inserted in two stages to stabilize the current source. Three or more stages are also possible. As illustrated in FIG. 5, a reference voltage is also used to stabilize the voltage of the current source resistor $R_1$ and to stabilize the output current $I_{R1}$. If the reference voltage is $V_R$, the current $I_{R1}$ can be expressed by the following equation:

$$I_{R1} = \frac{1}{R_1} \cdot \frac{R_5}{R_5 + R_6} V_R$$

Applying Ohm's Law, $$V_{ref} = (V_R - V_c) \cdot \left(\frac{R_5}{R_5 + R_6}\right) + V_{be2},$$

and the following inequality must be met for the reasons set forth above with respect to $V_{b1}$ and $V_{b2}$:

$$V_{b2} - 1.5 \text{ V} > V_{ref}.$$

If the base current component in a bipolar type transistor is desired to be deleted, part or all of the transistors in FIG. 5 may be replaced with field effect transistors.

We claim:

1. A differential switching circuit receiving complementary first and second input signals, said circuit comprising:
    a first current switching circuit having a first input terminal operatively connected to receive the first input signal, and having a first switching threshold voltage;
    a second current switching circuit, operatively connected to said first current switching circuit, having an output terminal and a second input terminal, for receiving the second input signal, and having a second switching threshold voltage different from the first switching threshold voltage; and
    a constant current source having a circuit end commonly connected to said first and second current switching circuits.

2. A differential switching circuit according to claim 1, wherein each of said first and second current switching circuits comprises an n-p-n type transistor.

3. A differential switching circuit according to claim 1,
    wherein said first current switching circuit comprises a first transistor operatively connected to said constant current source, ground and the first input terminal, and
    wherein said second current switching circuit comprises:
        a second transistor having a collector operatively connected to ground, a base operatively connected to receive the second input signal and an emitter; and
        a third transistor having a collector operatively connected to the collector of said second transistor, a base operatively connected to the emitter of said second transistor and an emitter operatively connected to said constant current source.

* * * * *